United States Patent [19]
Nakajima

[11] Patent Number: 5,528,047
[45] Date of Patent: Jun. 18, 1996

[54] ELECTRON BEAM EXPOSURE APPARATUS WITH IMPROVED DRAWING PRECISION

[75] Inventor: Ken Nakajima, Tokyo, Japan

[73] Assignee: NEC Corporation, Japan

[21] Appl. No.: 490,353

[22] Filed: Jun. 14, 1995

[30] Foreign Application Priority Data

Jun. 17, 1994 [JP] Japan .................... 6-159178

[51] Int. Cl.⁶ .................................... H01J 37/304
[52] U.S. Cl. .................... 250/491.1; 250/310; 250/492.2
[58] Field of Search .............. 250/491.1, 492.2, 250/398, 310

[56] References Cited

U.S. PATENT DOCUMENTS

| | | | |
|---|---|---|---|
| 3,875,414 | 4/1975 | Prior | 250/398 |
| 4,068,381 | 1/1978 | Ballard et al. | 250/310 |
| 4,109,029 | 8/1978 | Ozdemir et al. | 250/492.2 |
| 5,043,586 | 8/1991 | Girffre et al. | 250/491.1 |
| 5,047,647 | 9/1991 | Itoh et al. | 250/491.1 |
| 5,384,463 | 1/1994 | Honjo et al. | 250/398 |
| 5,430,292 | 7/1995 | Honjo | 250/398 |

FOREIGN PATENT DOCUMENTS

62-101 1/1987 Japan .
63-278350 11/1988 Japan .

*Primary Examiner*—Bruce C. Anderson
*Attorney, Agent, or Firm*—Hayes, Soloway, Hennessey, Grossman & Hage

[57] ABSTRACT

An electron beam exposure apparatus includes an electron beam generating section for generating a beam composed of electrons accelerated with a predetermined acceleration voltage, and a stage for mounting thereon a semiconductor wafer or reticle to be exposed by the electron beam. The stage includes a reference marker composed of a base section and a projection section. The base section is formed of a thin film of first conductive element having an atomic number greater than that of a material of the stage and has a first thickness through which more than 70% electrons in the beam can transmit and the projection section is formed of a bulk of second conductive element having an atomic number equal to or greater than that of the material of the stage and has a second thickness thicker than a maximum traveling distance of the electrons of the beam into the projection section. The electron beam exposure apparatus further includes an optical system for adjusting a deflection of the electron beam and a size of electron beam, and a detecting section for detecting electrons from the reference marker of the stage when the electron beam is irradiated on the reference marker of the stage in a calibration mode.

18 Claims, 10 Drawing Sheets

ELECTRON BEAM EXPOSURE APPARATUS WITH IMPROVED DRAWING PRECISION

BACKGROUND OF THE INVENTION

1. Field of the Invention

The present invention relates to an electron beam exposure apparatus, and more particularly, to improvement of calibration precision of position and beam size in the electron beam exposure apparatus.

2. Description of Related Art

Conventionally, in order to pattern a resist layer on a semiconductor wafer, an optical exposure apparatus has been used widely. However, as a high density of integration is required, a pattern becomes thin. Recently, a drawing precision of 0.05 μm or below is required for the exposure apparatus. Therefore, an electron beam exposure apparatus becomes interested. In an electron beam exposure apparatus, electron beam emitted from an electron gun is contracted thinly by an optical system and scanned by a deflecting unit to expose a resist layer. The electron beam exposure apparatus has an advantage in that a fine pattern can be formed, compared to the optical exposure apparatus such as a stepper. Also, the electron beam exposure apparatus has an advantage in that a mask is not used and the fine pattern is drawn on the resist layer directly by scanning the electron beam. However, the optical system of the electron beam exposure apparatus has an aberration inherent to the apparatus, that is to say, the aberration determined with mechanical precision when the apparatus is produced. Accordingly, an actual position of a deflected electron beam on a semiconductor wafer is displaced from a target position on the wafer. The displacement is the deflection distortion. For this reason, therefore, the defection of electron beam must be controlled with high precision and the optical system of the electron beam exposure apparatus must be calibrated for correction for deflection distortion before the resist pattern is actually exposed by the electron beam. Similarly, there is a difference between a desired beam size and an actual beam size. Therefore, the beam size needs to be also corrected based on the difference in beam size.

Figure 1A:
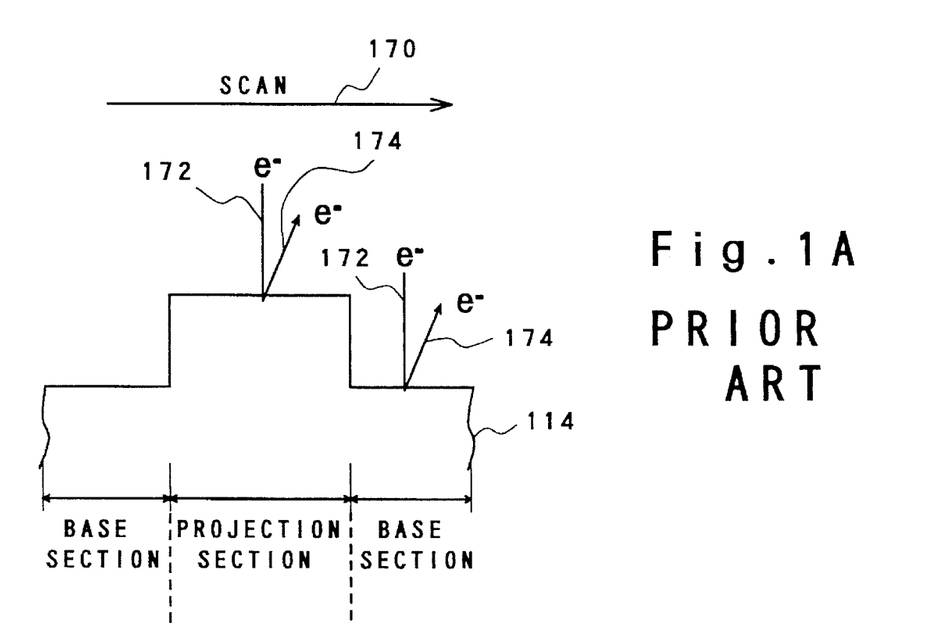
FIG. 1A is a diagram showing a conventional marker for detecting an exposure position.
Figure 1B:
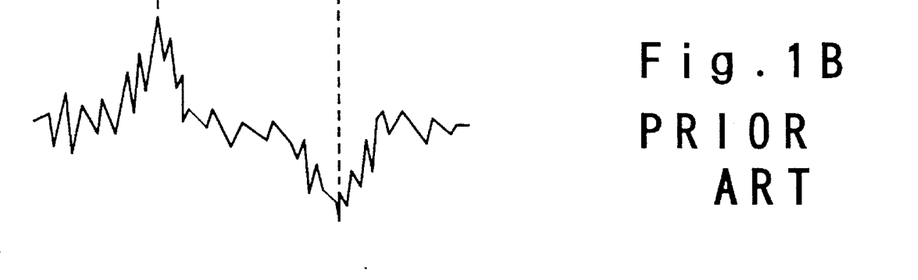
FIG. 1B is a differentiated waveform of a detected reflected electron signal.

In a conventional electron beam exposure apparatus, a calibration reference marker provided on a stage on which a semiconductor wafer is mounted is generally formed a bulk of metal. As shown in FIG. 1A, the calibration reference marker 114 has two sections, i.e., a projection section and a base section. In the calibration, when an electron beam 172 is irradiated on the calibration reference marker 114 and scanned in a direction shown by an arrow 170, electrons 174 reflected from the marker are detected by a detector to produce a reflected electron signal and the calibration is performed based on the reflected electron signal. The waveform when the reflected electron signal is differentiated by the inventor is shown in FIG. 1B. In this example, since the reference marker is formed of the bulk of metal so that electrons reflected from the base section provides background noise, an S/N ratio of the reflected electron signal from the projection section to the background noise is low so that detection precision of the deflection distortion and beam size are also low.

Figure 2A:
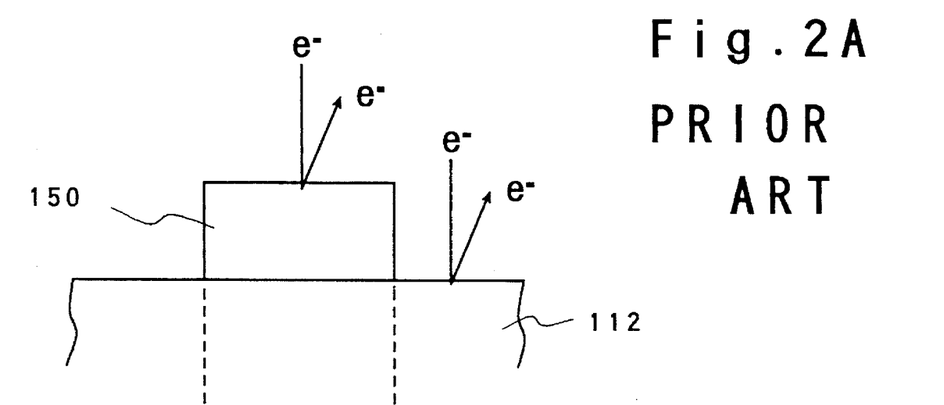
FIG. 2A is a diagram showing a conventional position detection marker used in a conventional apparatus.
Figure 2B:
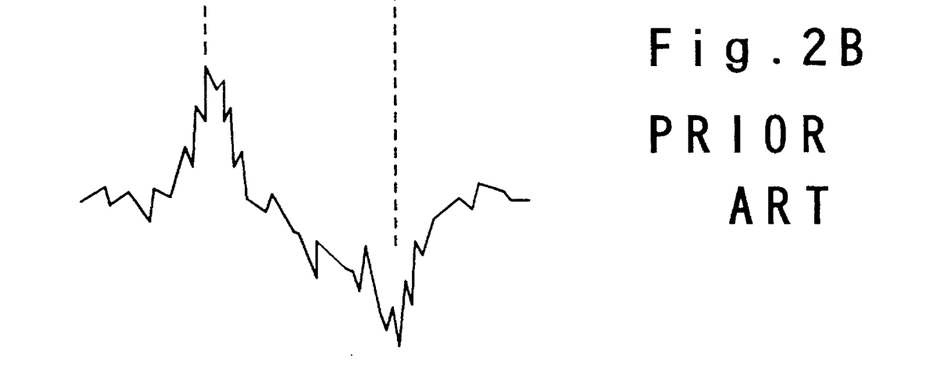
FIG. 2B is a differentiated waveform of a detected reflected electron signal.

The provision of a marker for detecting an exposure position which is not a calibration reference marker is disclosed in, for example, Japanese Laid Open Patent Disclosure (JP-A-Sho63-278350). As shown in FIG. 2A, the marker 150 made of heavy metal such as tungsten (W) or tantalum (Ta) is provided in a semiconductor structure 112 formed of a silicon layer, an aluminum layer or a silicon oxide ($Sio_2$) layer. In this example, an electron beam is irradiated on the marker on the semiconductor structure and reflected electrons are detected by a detector. FIG. 2B shows the waveform when the detected reflected electron signal is differentiated by the inventor. In this case, since the number of electrons reflected from the semiconductor structure 112 is less than that of electrons reflected from the marker 150, background noise is reduced so that the S/N ratio can be improved. However, the number of electrons reflected from the semiconductor structure 112 is sufficiently great and more than about 20% to 30% electrons in the incident electron beam are reflected to provide the background noise. As a result, the S/N ratio is as many as 2 to 3. This value corresponds to the detection precision of 0.07 μm. As described above, the drawing precision of 0.05 μm or below is required recently and the value obtained from the device shown in FIG. 2A cannot satisfy the required drawing precision. Therefore, there is the need for an electron beam exposure apparatus having the drawing precision of 0.05 μm or below.

SUMMARY OF THE INVENTION

Therefore, the present invention has, as an object, to provide a method of calibrating a deflection and size of an electron beam with an improved precision and an apparatus for the method.

Another object of the present invention is to provide a calibration reference marker which can provide an improved S/N ratio.

In order to achieve an aspect of the present invention, an electron beam exposure apparatus includes an electron beam generating section for generating a beam composed of electrons accelerated with a predetermined acceleration voltage, a stage including a reference marker composed of a base section and a projection section, for mounting thereon a target to be exposed by the electron beam, an optical system for adjusting a deflection of the electron beam and a size of electron beam, a detecting section for detecting electrons from the reference marker of the stage when the electron beam is irradiated on the reference marker of the stage in a calibration mode, and a control section for controlling the optical system based on the detecting result by the detecting means on each of a plurality of positions of the stage in the calibration mode to desired results of the deflection and beam size and controlling the optical system based on the desired results when the target is to be exposed by the electron beam.

The projection section is formed of a bulk of second conductive element having an atomic number greater than that of the material of the stage and has a second thickness thicker than a maximum traveling distance of the electrons of the beam into the projection section. Therefore, electrons of the electron beam are reflected with a reflection coefficient inherent to the material of the projection section. The base section may be formed of a film of first conductive element having an atomic number greater than that of a material of the stage and has a first thickness through which more than 70% electrons in the beam can transmit. Or, The base section may be formed of an electrically conductive organic film having and has a first thickness such that the base section has a reflection coefficient 30% or below. Thus, the number of electrons from the base section when the electron beam is irradiated to the base section can be significantly reduced so that the S/N ratio can be improved.

When a metal is used for the base section, both the projection and base sections are desirably made of a material selected from the group consisting of tungsten, tantalum, molybdenum, chromium, nickel, and copper which have an atomic number greater than 22. In a case of use of tungsten for the projection and base sections and the acceleration voltage of 50 KeV, the base section desirably has the first thickness in a range of 0.06 to 0.25 μm, and more desirably in a range of 0.1 to 0.25 μm.

When a conductive organic material is used for the base section, the projection section is desirably made of a material selected from the group consisting of tungsten, tantalum, molybdenum, chromium, nickel, and copper and the base section is desirably made of a material selected from the group consisting of polythienyl alkanesulfonic acid compound, tetracyano-quinodimethane, polyphenylene-vinylene. In this case, if the acceleration voltage is 20 KeV, the base section has desirably the first thickness of 0.5 μm or above, and more desirably, of 1.5 μm or above.

In order to achieve another aspect of the present invention, a method of calibrating an electron beam exposure apparatus comprising the steps of:

providing a stage for mounting thereon a target to be exposed by an electron beam, wherein the stage includes reference marker means which includes at least one a reference marker composed of a base section and a projection section, the base section is formed of a film of first conductive material and has a first thickness such that less than 30% electrons of the number of electrons in an electron beam are emitted from the base section when the electron beam is irradiated to the base section, and the projection section is formed of a bulk of second conductive material heavier than the material of the stage and has a second thickness thicker than a maximum traveling distance of the electrons of the beam into the projection section;

generating the electron beam accelerated with a predetermined acceleration voltage;

detecting electrons from the reference marker means of the stage on a plurality of positions on a horizontal plane at different heights in a vertical direction for every position when the electron beam is irradiated on the reference marker means of the stage while an optical system is adjusted with respect to a deflection of the electron beam and a size of the electron beam; and calculating and storing the adjusted values of the optical system as a function of position height, so that the target can be exposed based on the stored values.

A signal indicative of electrons emitted from the reference marker means is generated and differentiated. The adjusted values are calculated from the differentiated signal. More particularly, the position of the reference marker on the horizontal plane is determined from peaks of the differentiated signal, thereby to determine a desired deflection in the optical system and beam sizes at the different heights on the same position are determined to interpolate a desired beam size on the target.

DESCRIPTION OF THE PREFERRED EMBODIMENTS

An electron beam exposure apparatus according to the present invention will be described below with reference to the accompanying drawings.

Figure 3:
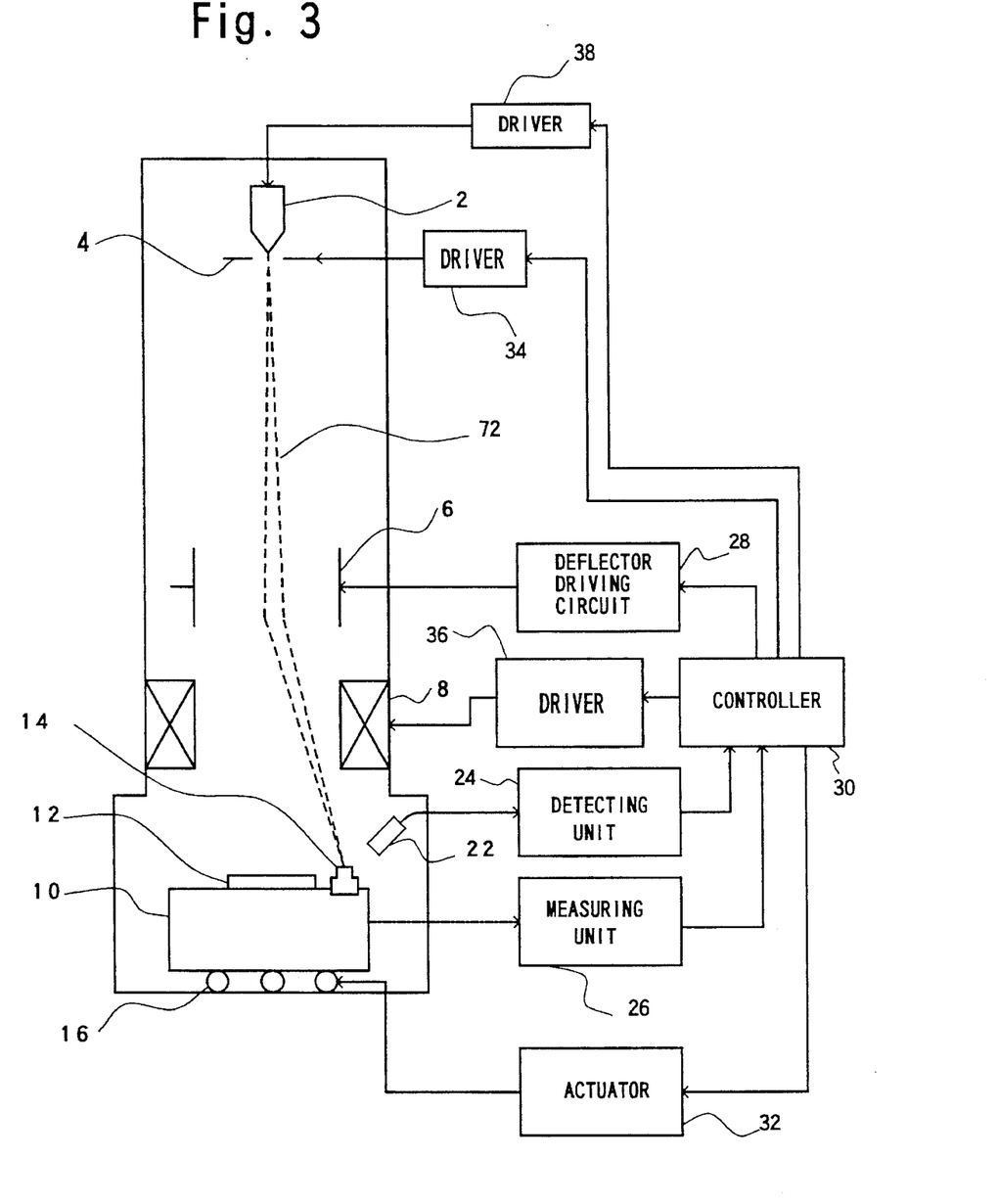
FIG. 3 is a block diagram showing an electron beam exposure apparatus according to an embodiment of the present invention.

First, the structure of the electron beam exposure apparatus according to an embodiment will be described below with reference to FIG. 3. In FIG. 3, The electron beam exposure apparatus includes an electron emitting system composed of an electron gun 2 and an acceleration electrode 4, an optical system composed of a deflection electrode 6 and an object lens 8, and a target system composed of a stage 10 having calibration reference marker s 14 for a semiconductor wafer 12 to be mounted on the stage 10 and a mechanical stage driving unit 16. All of the electron emitting system, optical system and target system are contained in a vacuum chamber in this embodiment. The electron beam exposure apparatus further includes a control and drive system having a controller 30 which controls the whole of the beam exposure apparatus. The control and drive system includes a driver 38 for driving the electron gun 2 in response to a generation signal from the controller 30 to emit electrons, a driver 34 for driving the acceleration electrode 4 in response to an acceleration signal from the controller 30 such that the electrons emitted from the electron gun are accelerated to, for example, 50 KeV or 20 KeV, and an actuator 32 for driving the mechanical driving unit 16 in response to a movement signal from the controller 30 such that the stage 10 is moved in two dimensional directions.

The control and drive system further includes a detector 22 for detecting electrons reflected from the calibration reference marker s 14, a detecting unit 24 for processing a signal indicative of the reflected electrons and outputting the processing result to the controller 30, and a measuring unit 26 for measuring the position of the stage 10 or semiconductor wafer 12 mounted on the stage 10 and outputting the measuring result to the controller 30. In addition, the control and drive system includes a deflector driving circuit 28 for drive the deflector electrode 6 in response to a deflection signal from the controller 30 to deflect the electron beam and a driver 36 for driving the object lens 8 in response to a focusing signal from the controller 30 to focus the electron beam on a desired position.

Figure 4A:
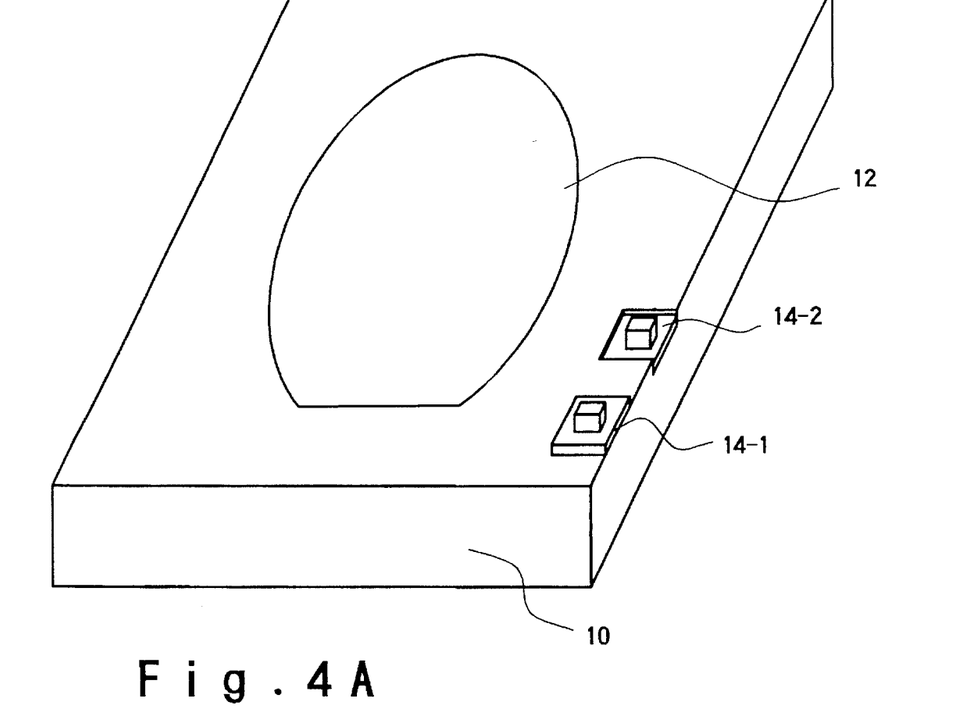
FIG. 4A is a schematically perspective view showing calibration reference marker s and a semiconductor wafer on a stage.

Next, referring to FIGS. 4A and 4B, the stage 10 and the structure of the calibration reference maker will be described below. In the embodiment, the stage 10 is made of a light material such as aluminum, silicon having an atomic number smaller than 22 and silicon oxide. In a case that the stage 10 is made of silicon oxide, a metal layer needs to be deposited on the silicon oxide to escape charge. The stage 10 includes two calibration reference markers 14-1 and 14-2 are provided on the stage 10 at the corner section of the surface on which the semiconductor wafer 12 or reticle is placed. The reference marker 14-1 is provided on the surface of stage 10 and the reference marker 14-2 is provided in the concave portion of the stage 10 adjacent to the marker 14-2. Each of the reference markers 14-1 and 14-2 has a base section 42-1 or 42-2 and a projection section 44-1 or 44-2. The projection section 44 is made of a heavy material such as tungsten (W) having an atomic number greater than that of the material of stage 10, e.g., 22. As a result, such a heavy material can effectively reflect electrons of an incident electron beam. Also, the projection section 44 needs to be conductive because the electron beam is irradiated. For instance, tantalum (Ta), molybdenum (Mo), and chrome (Cr) or alloy of them may be used as the material of projection section 44 other than tungsten. The base section 42 may be made of the same material as the projection section 44 or a different material from the projection section 44. In this embodiment, the base section is made of tungsten. The thicknesses of the base section 42-1 or 42-2 and the projection sections 44-1 or 44-2 in the height direction are determined based on the acceleration voltage by the acceleration electrode 4. More particularly, the thickness of the projection section 44-1 or 44-2 is desirably chosen in such a manner that the accelerated electrons in the beam cannot penetrate the projection section. Thus, the electrons in the beam would reflected from the projection section 44-1 or 44-2 with a reflection coefficient determined on the acceleration voltage and the material of projection section. When the acceleration voltage is 50 KeV, the thickness of the projection section is chosen to be 0.5 μm. The thickness of the base section 42-1 or 42-2 is desirably chosen in such a manner that a transmittance coefficient of electrons is equal to or more than 70%, i.e., a reflection coefficient is equal to or less than 30%. More particularly, in this case, more than 70% electrons in the beam can transmit the base section 42-1 or 42-2. When the acceleration voltage is 50 KeV, the thickness of the base section is desirably in a range of 0.06 μm to 0.25 μm. More desirably, the thickness of the base section is in a range of 0.1 μm to 0.25. In this range, the transmittance coefficient is equal to or more than 90%. If the thickness of the base section is below 0.06 μm or above 0.25 μm, the transmittance coefficient of electrons is lower than 70% because of reflection from the stage 10 or the base section. Therefore, these region are not suitable for the base section.

Figure 5A:
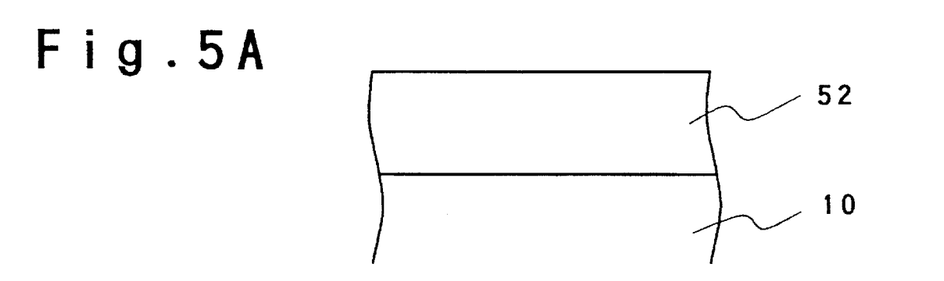
FIGS. 5A to 5C are diagrams showing a manufacturing process of the calibration reference marker.
Figure 5B:
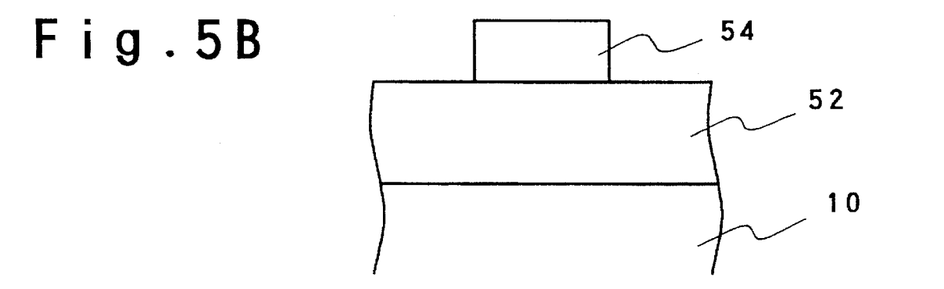
Figure 5C:
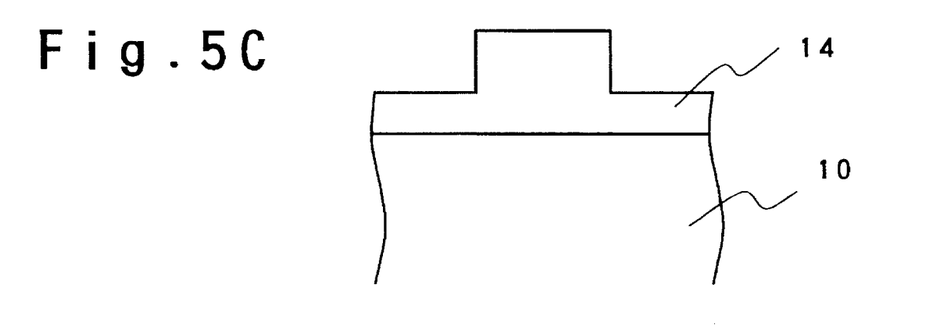
Figure 7A:
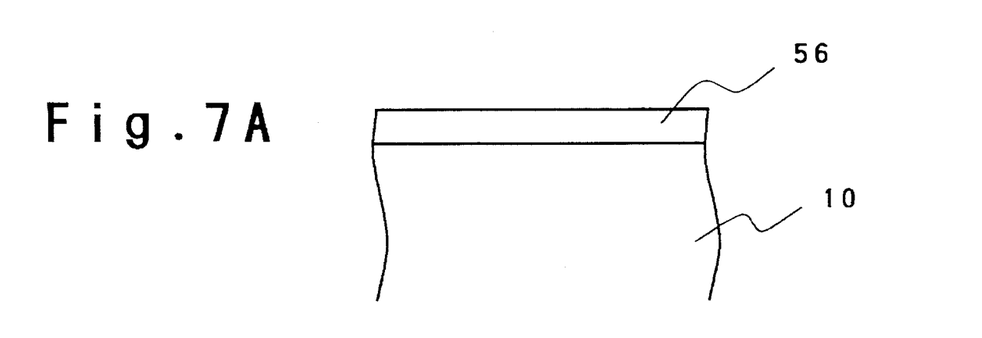
FIGS. 7A to 7C are diagrams showing another manufacturing process of the calibration reference marker.
Figures 7B, 7C:
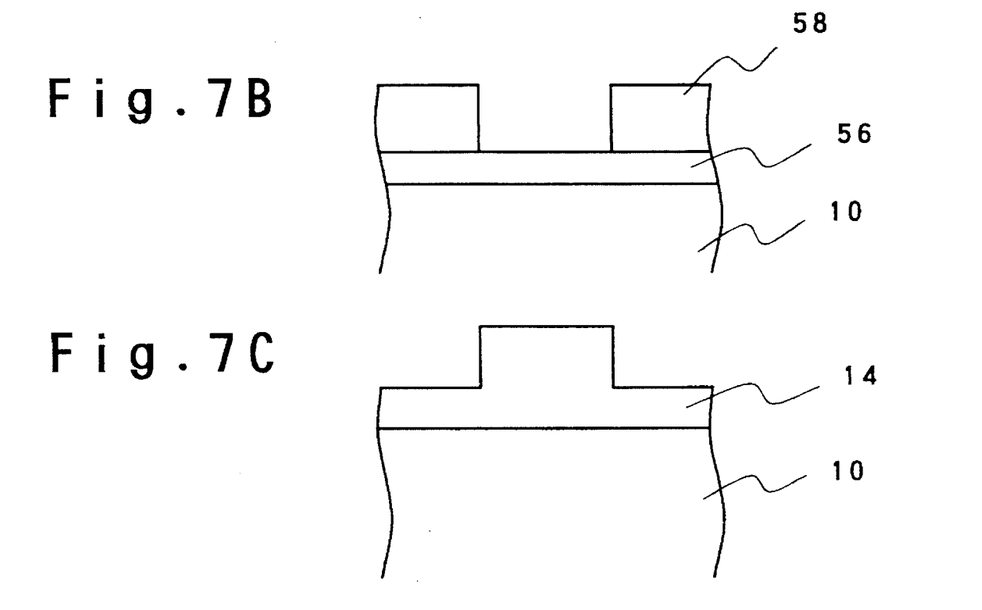

Next, the manufacturing method of the calibration reference marker will be described below with reference to FIGS. 5A to 5C. First, as shown in FIG. 5A, a layer 52 of heavy metal such as tungsten is deposited on the stage 10 made of a light element such as aluminum by a CVD or sputtering method to have a thickness of 0.5 μm or above. Next, as shown in FIG. 5B, a mask 54 of photoresist or silicon oxide ($SiO_2$) is formed on the heavy metal layer 52. Next, as shown in FIG. 5C, the heavy metal layer 52 is patterned by the well-known dry etching method such that the projection section has the thickness of 0.5 μm or above and the base section has the thickness of about 0.1 μm. In this manner, the calibration reference marker 14 can be manufactured. However, another method may be employed. For instance, as shown in FIG. 7A, a heavy metal layer 56 of 0.1 μm in thick is first formed on the stage 10. Next, as shown in FIG. 7B, an insulating film 58 formed of $SiO_2$ or $Si_3N_4$ is deposited on the heavy metal layer 56 to have the thickness of about 0.5 μm by a CVD method and the insulating film 58 is patterned by a wet etching method or a dry etching method, using a photoresist pattern (not shown) as a mask. Finally, as shown in FIG. 7C, the heavy metal layer is selectively deposited by a CVD method to fill the opening of the insulating layer 58 and then the insulating layer 58 is removed. According to the method shown in FIGS. 7A to 7C, the thickness of the base section can be advantageously controlled with high precision, compared to the method shown in FIGS. 5a to 5C.

Next, the calibration method of the electron beam exposure apparatus will be described below.

Figure 4B:
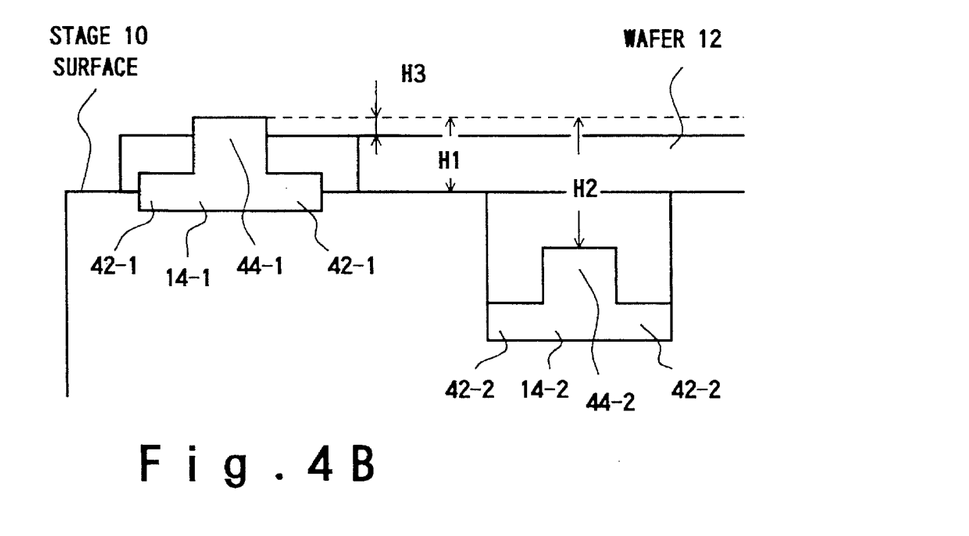
FIG. 4B is a diagram showing a relation in a height direction between the marker s and the semiconductor wafer shown in FIG. 4A.

First, referring to FIG. 4B, the distance H1 from the surface of the reference marker 14-1 to the surface of the stage 10 and the distance from the surface of the reference marker 14-2 to the surface of the stage 10 are measured by use of the measuring unit 26 such as a laser interferometer. An optical detecting apparatus may be used which is disclosed in Japanese Laid Open Patent Disclosure (JP-A-Sho62-1011). The measuring results are supplied to the controller 30. The controller 30 calculates the distance H2 from the surface of the reference marker 14-2 to the surface of the reference marker 14-1. Then, a semiconductor wafer 12 is mounted on the stage 10 in such a manner that the surface of the semiconductor wafer 12 is located between the surface of the reference marker 14-1 and the surface of the reference marker 14-2. Then the height of the semiconductor wafer 12 is measured by the measuring unit 26 and the measuring result is outputted to the controller 30. The controller 30 calculates the distance H3 from the surface of the reference marker 14-1 to the surface of the semiconductor wafer 12.

Next, an instruction is inputted to the controller 32 which issues the movement signal to the actuator 32 such that the stage 10 is moved in a horizontal direction to a position where an electron beam is irradiated to the calibration reference marker 14-1 with no deflection. Subsequently, the position of reference marker 14-1 is measured by the measuring unit 26 and outputted to the controller 30. Then, an instruction is inputted to the controller 32 which issues the generation and acceleration signals to the drivers 38 and 34 so that electrons are emitted from the electron gun 2 to form an electron beam and the electrons in the beam are accelerated to 50 KeV and irradiated to the calibration reference marker 14-1. At this time, the deflector driving circuit 28 is controlled by the controller 30 such that the electron beam 72 are scanned by the deflector 6 in a direction as shown by an arrow 70 in FIG. 6A.

Figure 6A:
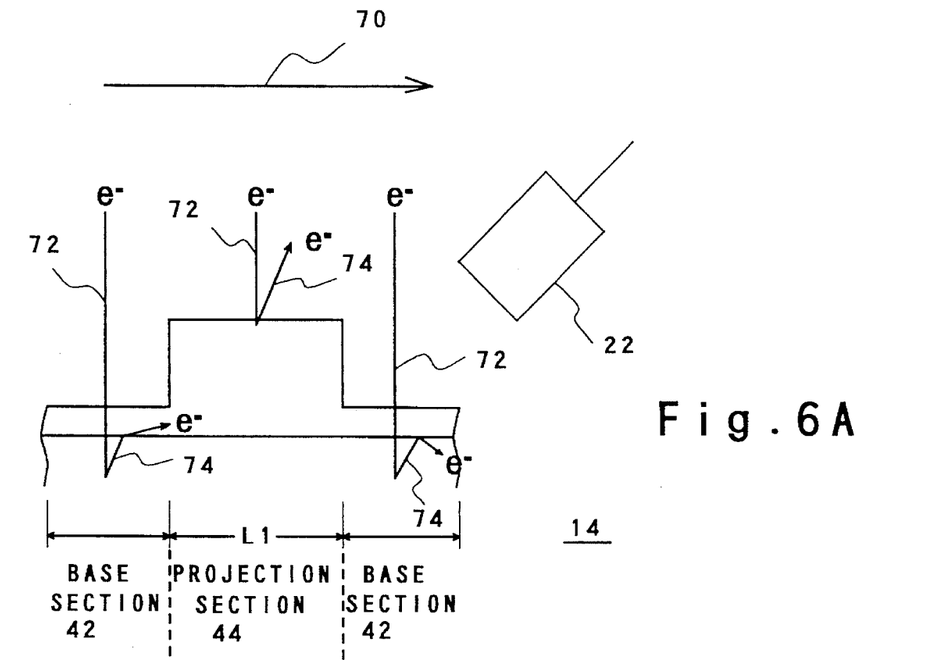
FIG. 6A is a diagram showing the state when an electron beam is irradiated on the calibration reference marker used in the electron beam exposure apparatus according to the present invention.

In this case, when the acceleration voltage is 50 KeV and the reference marker 14 is made of tungsten, a maximum travelling distance of electrons into the bulk of tungsten is about 0.5 μm. It could be considered that a static probability distribution of incident electrons into a bulk material is usually a Gaussian distribution. Therefore, if the thickness of the base section 42 is chosen to be 0.1 μm which is about one-fifth of the maximum travelling distance as in this embodiment, the more than 90% electrons in the beam can transmit the base section 42. Since the stage 10 is made of the light material such as aluminum, the electrons penetrating the base section 42 go to deeply the inside of the stage 10 and scattered there. Since a light material such as aluminum has a low density and a small atomic radius, the probability that the entered electron is scattered is very low so that almost electrons does not reenter the base section 42 or thin heavy material layer. Even if a part of electrons entered the stage 10 is scattered to be reflected into a direction of the base section 42, the reflected electron would be scattered at the interface between the base section 42 and the stage 10 or scattered in the base section 42, to loss the energy. There is almost no electron emitted or reflected from the base section 42.

When the electron beam is irradiated to the projection section 44, many electrons are reflected from the projection section 44 based on the reflection coefficient inherent to the material of projection section 44. Then, when the electron beam is scanned to the base section 42 on the right side again, the same as described above occurs.

Figure 6B:
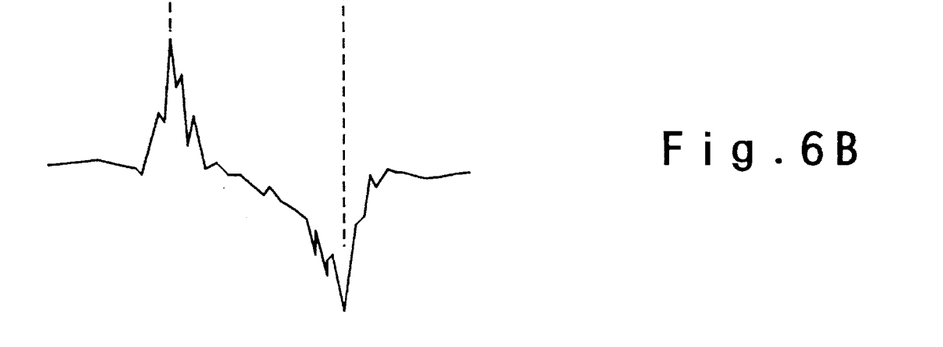
FIG. 6B is a differentiated waveform of a detected reflected electron signal obtained in the state shown in FIG. 6A.

The electron beam 72 is repeatedly scanned by the deflector 6 while the object lens 8 is controlled by the controller 30 via the driver 36 such that the most desirable beam size is obtained, and the electrons from the reference marker 14-1 are detected by the detector 22 which outputs a signal indicative of reflected electrons. The detecting unit 24 performs a primary differentiation on the reflected electron signal to obtain a differentiated signal as shown in FIG. 6B. This differentiated signal has two peaks at positions corresponding to the steps between the base section 42 and the projection section 44. This peak has so high that the improved S/N ratio of 4 to 5 can be achieved because the background noise from the base section 42 is significantly reduced. As a result, the detection precision of 0.05 μm or below can be achieved. The actual stage 10 position in a horizontal plane can be determined based on the peak positions of the differentiated signal and the beam size can be determined based on a width of the peak, for example, a half band width of the peak. Thus, a control value of the object lens 8 for the desired beam size is stored in the controller 30 as a function of horizontal position and height.

Next, the calibration reference marker 14-2 is moved to the position where the electron beam is irradiated to the projection section 44 with no deflection and the same measurement is performed. In this case, since the calibration reference marker 14-2 is provided on the stage 10 in the concave portion, the stage 10 needs not to be moved in a height direction. The stage 10 is sufficient to be moved on the same horizontal plane. Therefore, the mechanical driving section 16 may have a simple structure only. Thus, the desired beam size and hence another control value of the object lens 8 can be determined at that position where the electron beam is irradiated with no deflection and is sent to the controller 30. The controller 30 interpolates the desired beam size on the semiconductor wafer 12 from the heights H1, H2 and H3 and the measured beam sizes for the reference markers 14-1 and 14-2 and the control value of the object lens 8 for the desired beam size.

Next, the same measurement is performed at a different position. As the result, the desired beam size is also determined at the position. Further, a desired degree of deflection can be determined from the measured stage positions. All the determined values are sent to the controller 30. The controller 30 determines a control value of a deflector 6 and stores therein it as a function of horizontal position and height. The above determined control value of the object lens 8 and the control value of the deflector 6 are used for the semiconductor wafer 12 by the controller 30 when the wafer 12 is to be actually exposed.

Next, the electron beam exposure apparatus according to another embodiment of the present invention will be described below with reference to FIGS. 8A to 10. In the embodiment, the calibration reference marker 14 has the same structure as shown in the above-mentioned embodiment and composed of a base section 46 and a projection section 44. However, an organic film is employed as the base section of the calibration reference marker 14. The projection section is made of a heavy metal material such as tungsten and tantalum.

Figure 8A:
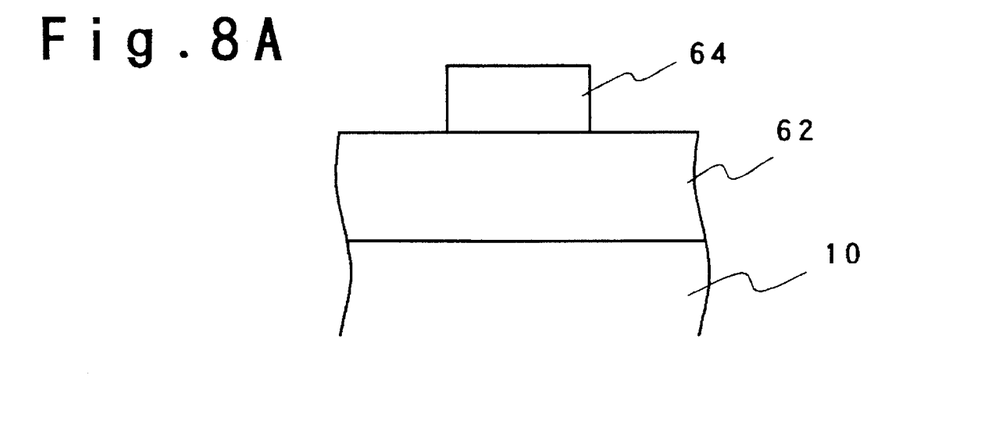
FIGS. 8A to 8C are diagrams showing a manufacturing process of a calibration reference marker according to another embodiment of the present invention.
Figure 8B:
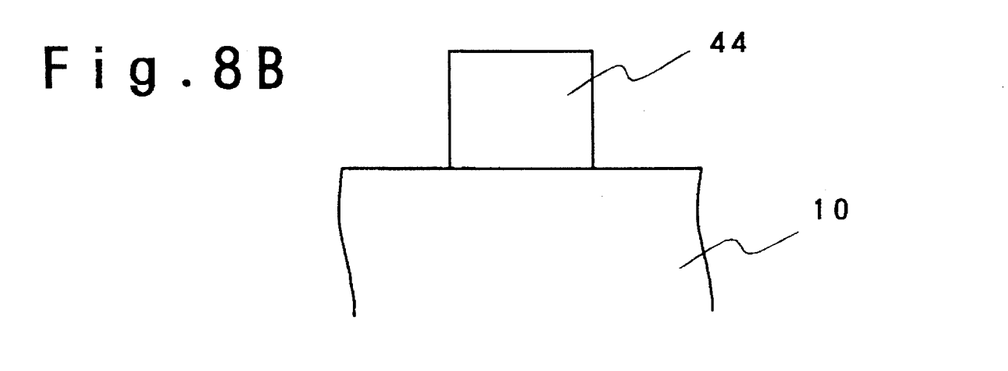
Figure 8C:
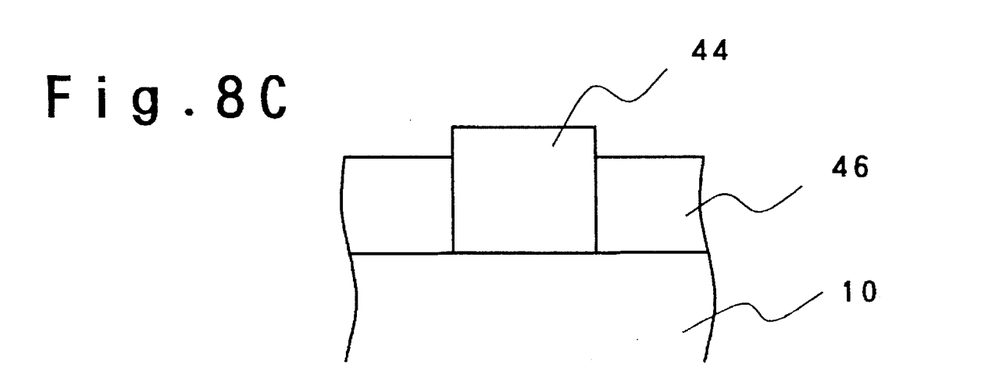

First, referring to FIGS. 8a to 8C, the manufacturing method of the calibration reference marker will be described below. As shown in FIG. 8a, a heavy metal layer 62 of about 2.5 μm is first deposited on the stage 10 made of a light metal layer such as aluminum by a CVD method or a sputtering method. Then a resist layer 64 is formed and patterned on the heavy metal layer 62 using a well-known lithography technique. Next, as shown in FIG. 8B, a dry etching is performed so that the projection section 44 is formed of the heavy metal layer. Subsequently, as shown in FIG. 8C, an electrically conductive organic film 46 is formed as the base section 46 by a spin coating method to have a thickness of about 2 μm. As a result, the calibration reference marker can be obtained.

Figure 9A:
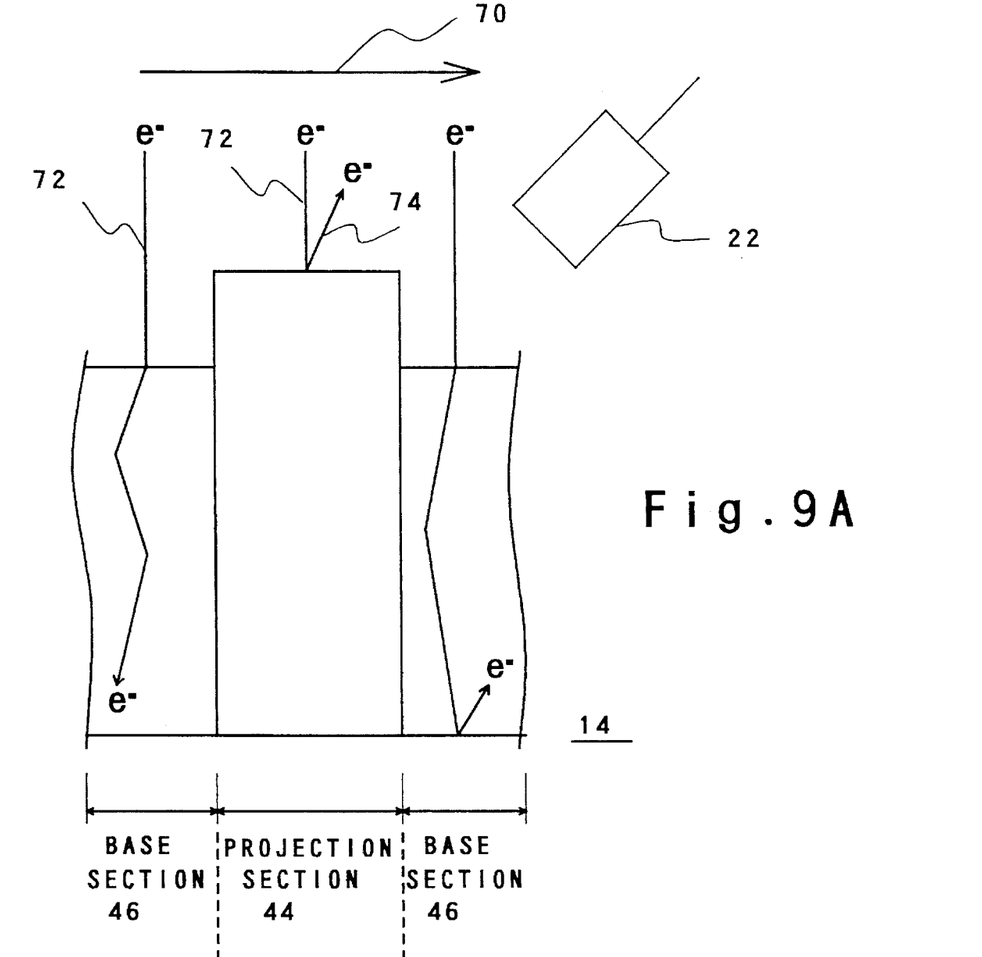
FIG. 9A is a diagram showing the state when an electron beam is irradiated on the calibration reference marker used in the electron beam exposure apparatus according to the present invention.
Figure 9B:
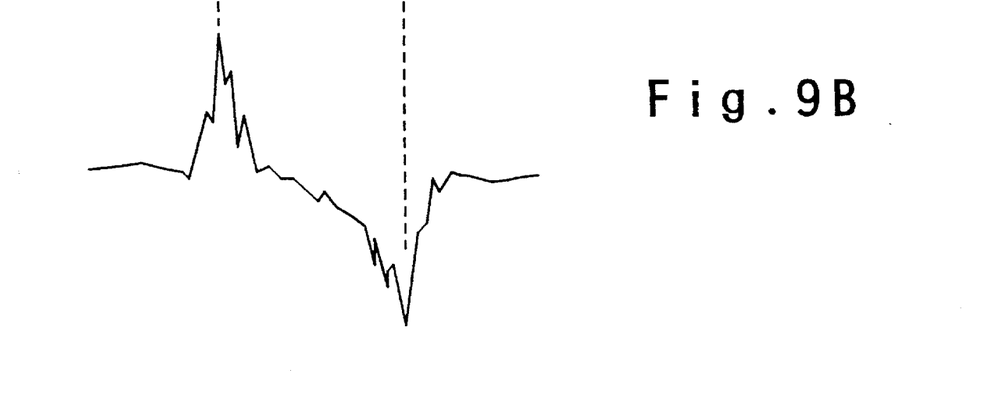
FIG. 9B is a differentiated waveform of a detected reflected electron signal obtained in the state shown in FIG. 9A.
Figure 10:
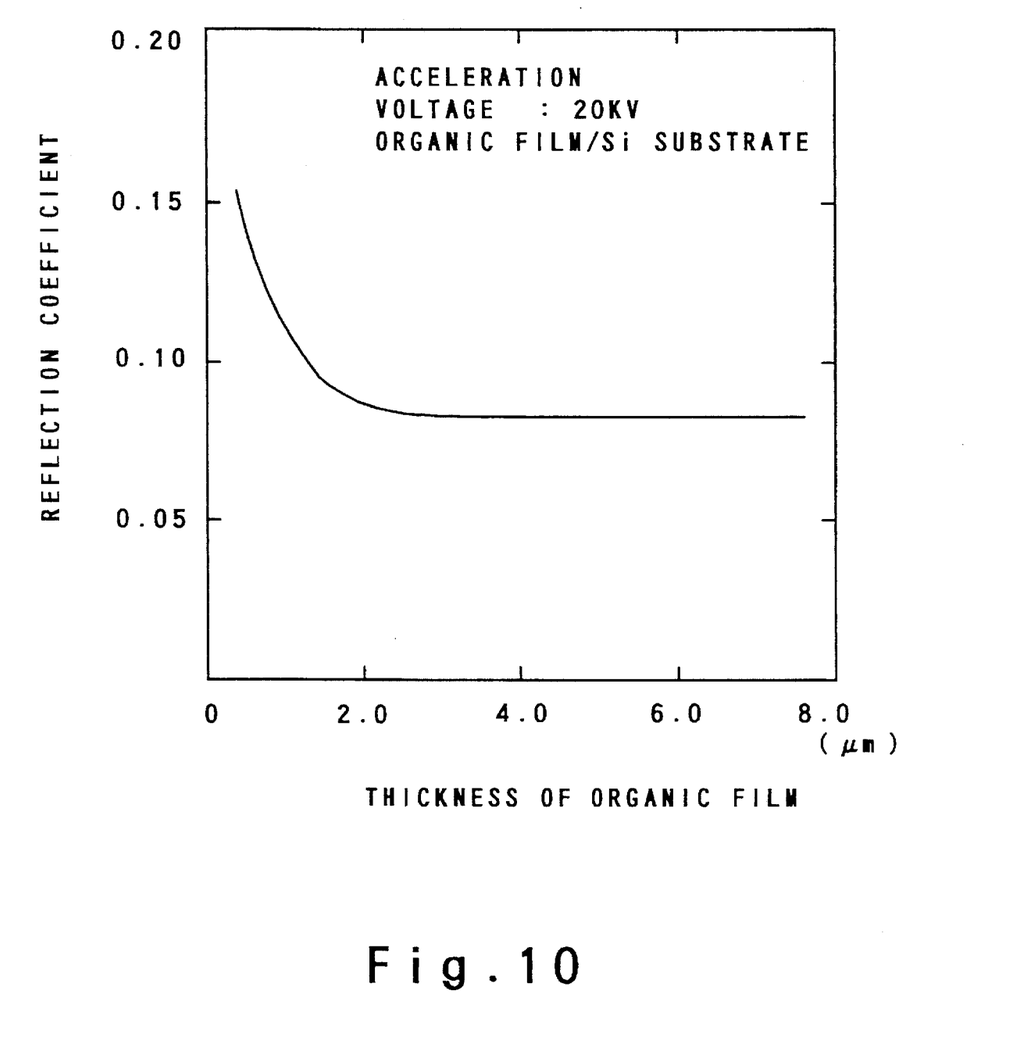
FIG. 10 is a graph showing a calculation result of reflection coefficient for a thickness of an organic film.

Next, the calibration method of the electron beam exposure apparatus will be described with reference to FIG. 9A. The calibration method is basically the same as in the above-mentioned embodiment. In this embodiment, the acceleration voltage of electrons is 20 KeV and the number of electrons reflected from the base section 46 can be reduced. FIG. 10 is a graph showing the result of Monte Carlo calculation of reflection coefficient in a case of use of a Rutherford scattering (elastic scattering) model and a Bethe stopping power (inelastic scattering) model. As shown in FIG. 10, in a case of the acceleration voltage of 20 KeV, when the thickness of the base section 46 is 0.5 μm or above, the reflection coefficient is 0.15 (15%) or below. If the thickness of the base section 46 is 1.5 μm or above, the reflection coefficient becomes 0.1 (10%) or below so that the background noise can be further reduced. The reflection coefficient means a ratio of the number of electrons outcoming from the conductive organic film to the number of electrons in the incident electron beam. Therefore, when the base section 46 has the thickness of 1.5 μm or above, more than 90% electrons of the incident electron beams does not become reflected electrons and the background noise can be reduced. As a result, the S/N ratio can be improved and the detection precision of the step portion can be 0.03 μm. Therefore, the deflection distortion and beam size can be calibrated in unit of 0.03 μm.

A material such as polythienyl alkanesulfonic acid compound, tetracyano-quinodimethane, polyphenylene-vinylene is suitable for the material of the electric conductive organic film as the base section.

According to the present invention, as described above, the base section of the calibration reference marker is formed to have a thickness such that the transmittance coefficient of electrons in the beam is 70% or above.

Therefore, the background noise due to the electrons reflected from the base section can be significantly reduced. As a result, the S/N ratio can be improved to about 4 to 5. This corresponds to the detection precision of 0.05 μm or below.

Further, when the transmittance coefficient of 90% or above or the reflection coefficient of 10% or below is achieved, the detection precision of 0.03 μm can be achieved. Therefore, the electron beam exposure apparatus according to the present invention can be used for a higher density of integration semiconductor device.

Furthermore, the electron beam exposure apparatus according to the present invention has the simple structure because the stage needs not to be moved in a height direction, resulting in superior operability.

What is claimed is:

1. An electron beam exposure apparatus comprising:
   electron beam generating means for generating a beam composed of electrons accelerated with a predetermined acceleration voltage;
   a stage for mounting thereon a target to be exposed by said electron beam, wherein said stage includes a reference marker composed of a base section and a projection section, said base section is formed of a film of first conductive element having an atomic number equal to or greater than that of a material of said stage and has a first thickness through which more than 70% electrons in said beam can transmit and said projection section is formed of a bulk of second conductive element having an atomic number greater than that of the material of said stage and has a second thickness thicker than a maximum traveling distance of the electrons of said beam into said projection section;
   an optical system for adjusting a deflection of said electron beam and a size of electron beam;
   detecting means for detecting electrons from said reference marker of said stage when said electron beam is irradiated on said reference marker of said stage in a calibration mode; and
   control means for controlling said optical system based on the detecting result by said detecting means on each of a plurality of positions of said stage in the calibration mode to desired results of the deflection and beam size and controlling said optical system based on the desired results when said target is to be exposed by said electron beam.

2. An electron beam exposure apparatus according to claim 1, wherein said projection section is made of one of metal elements having an atomic number greater than 22.

3. An electron beam exposure apparatus according to claim 1, wherein said base section is made of one of metal elements having an atomic number greater than 22.

4. An electron beam exposure apparatus according to claim 1, wherein said projection and base sections are both made of a material selected from the group consisting of tungsten, tantalum, molybdenum, chromium, nickel, and copper.

5. An electron beam exposure apparatus according to claim 1, wherein said base section has the first thickness through which more than 90% electrons in said beam can transmit.

6. An electron beam exposure apparatus according to claim 1, wherein said acceleration voltage is 50 KeV, said base section is made of tungsten and has said first thickness in a range of 0.06 to 0.25 μm, and said projection section is made of tungsten and has the second thickness of 0.5 μm or above.

7. An electron beam exposure apparatus according to claim 6, wherein said first thickness of said base section is in a range of 0.1 to 0.25 μm.

8. An electron beam exposure apparatus comprising:
   electron beam generating means for generating a beam composed of electrons accelerated with a predetermined acceleration voltage;
   a stage for mounting thereon a target to be exposed by said electron beam, wherein said stage includes a reference marker composed of a base section and a projection section, said base section is formed of an electrically conductive organic film having and has a first thickness such that said base section has a reflection coefficient 30% or below and said projection section is formed of a bulk of conductive material having an atomic number greater than that of a material of said stage and has a second thickness thicker than a maximum traveling distance of the electrons of said beam into said projection section;
   an optical system for adjusting a deflection of said electron beam and a size of electron beam;
   detecting means for detecting electrons from said reference marker of said stage when said electron beam is irradiated on said reference marker of said stage in a calibration mode; and
   control means for controlling said optical system based on the detecting result by said detecting means on each of a plurality of positions of said stage in the calibration mode to desired results of the deflection and beam size and controlling said optical system based on the desired results when said target is to be exposed by said electron beam.

9. An electron beam exposure apparatus according to claim 8, wherein said projection section is made of a material selected from the group consisting of tungsten, tantalum, molybdenum, chromium, nickel, and copper.

10. An electron beam exposure apparatus according to claim 8, wherein said base section is made of a material selected from the group consisting of polythienyl alkanesulfonic acid compound, tetracyano-quinodimethane, polyphenylene-vinylene.

11. An electron beam exposure apparatus according to claim 8, wherein said base section has the first thickness such that said base section has the reflection coefficient of 0.1 or below.

12. An electron beam exposure apparatus according to claim 8, wherein said acceleration voltage is about 20 KeV, said base section has said first thickness of 0.5 μm or above, and said projection section is made of tungsten and has the second thickness of 0.5 μm or above.

13. An electron beam exposure apparatus according to claim 12, wherein said first thickness of said base section is 1.5 μm or above.

14. A method of calibrating an electron beam exposure apparatus comprising the steps of:
   providing a stage for mounting thereon a target to be exposed by an electron beam, wherein said stage includes reference marker means which includes at least one a reference marker composed of a base section and a projection section, said base section is formed of a film of first conductive material and has a first thickness such that less than 30% electrons of the number of electrons in an electron beam are emitted from said base section when the electron beam is irradiated to said base section, and said projection section is formed of a bulk of second conductive material heavier than the material of said stage and has a second thickness thicker than a maximum traveling distance of the electrons of said beam into said projection section;

generating said electron beam accelerated with a predetermined acceleration voltage;

detecting electrons from said reference marker means of said stage on a plurality of positions on a horizontal plane at different heights in a vertical direction for every position when said electron beam is irradiated on said reference marker means of said stage while an optical system is adjusted with respect to a deflection of said electron beam and a size of said electron beam; and calculating and storing the adjusted values of said optical system as a function of position height, so that the target can be exposed based on the stored values.

15. A method according to claim 14, wherein said detecting step includes generating a signal indicative of electrons emitted from said reference marker means and differentiating the signal, and said calculating step includes calculating the adjusted values from the differentiated signal.

16. A method according to claim 15, wherein said calculating step includes determining the position of said reference marker on the horizontal plane from peaks of the differentiated signal, thereby to determine a desired deflection in said optical system and determining beam sizes at the different heights on the same position to interpolate a desired beam size on said target.

17. An electron beam control apparatus comprising:

electron beam generating means for generating a beam composed of electrons accelerated with a predetermined acceleration voltage;

a stage including at least two reference markers provided to have different heights and each composed of a base section and a projection section, said base section being formed of a conductive film having a reflection rate of 30% or below or a transmittance rate of 70% or above and said projection section being formed of a bulk of conductive material having a maximum traveling distance of the electrons of said beam into said projection section;

an optical system for adjusting a deflection of said electron beam; and determining means for detecting electrons from said at least two reference marker, respectively differentiating signals indicative of the electrons from said at least two reference marker, and determining a position of said electron beam on said stage from peaks of the differentiated signals.

18. An electron beam control apparatus according to claim 17, wherein said determining means determines a beam size from a width of the peak of the differentiated signals.

* * * * *